(12) United States Patent
Cole-Yocom et al.

(10) Patent No.: US 11,541,358 B2
(45) Date of Patent: Jan. 3, 2023

(54) METHOD FOR PROCESSING CHEMICAL LIQUID

(71) Applicant: FUJIFILM Electronic Materials U.S.A., Inc., North Kingstown, RI (US)

(72) Inventors: Marcia Cole-Yocom, Scottsdale, AZ (US); Bryan Hinzie, Gilbert, AZ (US); Michael Barker, Goodyear, AZ (US); Jack Helzer, Chandler, AZ (US); Shen-Ping Huang, HsinChu County (TW); Pejman Ahmadiannamini, Gilbert, AZ (US); Yuan Chen, Chandler, AZ (US)

(73) Assignee: FUJIFILM Electronic Materials U.S.A., Inc., North Kingstown, RI (US)

( * ) Notice: Subject to any disclaimer, the term of this patent is extended or adjusted under 35 U.S.C. 154(b) by 224 days.

(21) Appl. No.: 16/546,315

(22) Filed: Aug. 21, 2019

(65) Prior Publication Data

US 2020/0061544 A1 Feb. 27, 2020

Related U.S. Application Data

(60) Provisional application No. 62/720,890, filed on Aug. 21, 2018.

(51) Int. Cl.
*B01D 65/02* (2006.01)
*B01D 61/02* (2006.01)
(Continued)

(52) U.S. Cl.
CPC .......... *B01D 65/02* (2013.01); *B01D 61/026* (2022.08); *B01D 61/027* (2013.01); *B01D 71/36* (2013.01);
(Continued)

(58) Field of Classification Search
CPC .... B01D 65/02; B01D 61/027; B01D 61/022; B01D 71/36; B01D 2311/02;
(Continued)

(56) References Cited

U.S. PATENT DOCUMENTS 4,778,532 A * 10/1988 McConnell ............. B05C 3/109
134/10
5,733,441 A 3/1998 Ko et al.
(Continued)

FOREIGN PATENT DOCUMENTS

JP 2001353424 12/2001
WO 2018043697 3/2018

OTHER PUBLICATIONS

"International Search Report (Form PCT/ISA/210) of PCT/US2019/047367," dated Oct. 21, 2019, pp. 1-2.
(Continued)

*Primary Examiner* — Pranav N Patel
(74) *Attorney, Agent, or Firm* — JCIP Global Inc.

(57) ABSTRACT

A method for process a chemical liquid is provided. The method includes at least providing a system having at least one filtration medium, treatment the system with a treatment liquid having a content of iron (Fe) and calcium (Ca) of about 10 ppb or less, and processing a chemical liquid using an apparatus having the system configured therein after the treatment process.

17 Claims, 4 Drawing Sheets

(51) Int. Cl.
  *H01L 21/67*       (2006.01)
  *B01D 71/36*       (2006.01)
(52) U.S. Cl.
  CPC .... *H01L 21/67017* (2013.01); *B01D 2311/02* (2013.01)
(58) Field of Classification Search
  CPC ........ B01D 2321/16; B01D 2311/2623; B01D 2311/2626; H01L 21/67017
  See application file for complete search history.

(56) References Cited

U.S. PATENT DOCUMENTS

| | | |
|---|---|---|
| 2003/0168088 A1 | 9/2003 | Watanabe et al. |
| 2007/0007196 A1 | 1/2007 | Komatsu et al. |
| 2013/0174868 A1 | 7/2013 | Muraoka et al. |
| 2015/0160558 A1 | 6/2015 | Lo et al. |
| 2016/0228823 A1 | 8/2016 | Seo et al. |

OTHER PUBLICATIONS

"Written Opinion of the International Searching Authority (Form PCT/ISA/237) of PCT/US2019/047367," dated Oct. 21, 2019, pp. 1-6.

\* cited by examiner

METHOD FOR PROCESSING CHEMICAL LIQUID

CROSS-REFERENCE TO RELATED APPLICATION

This application claims the priority benefit of U.S. provisional application Ser. No. 62/720,890, filed on Aug. 21, 2018. The entirety of the above-mentioned patent application is hereby incorporated by reference herein and made a part of this specification.

BACKGROUND

1. Related Field

The present disclosure relates to a method for processing a chemical liquid, and more particularly to a method of purifying a chemical liquid used in semiconductor manufacturing.

2. Description of the Related Art

Due to the increasing demands on higher integration and higher performance of semiconductor devices, as represented by large scale integrated circuits (hereinafter as "LSI") and the like, new precision and high resolution processing techniques have been developed and adopted in the fabrication of LSI.

During the manufacturing of high resolution integrated circuits, various processing liquids will come into contact with a bare wafer or a film-coated wafer. For example, the fabrication of a fine metal interconnection typically involves a procedure of coating a base material with a pre-wetting liquid before the base material is coated with a composite liquid for forming a resist film, exposing the resist film so as to have a pattern shape, performing a developing treatment by using a developer, and washing the patterned resist film by using a rinsing solution. These processing liquids, containing propriety ingredients and various additives, are known to be a source of contamination of IC wafer.

It has been demonstrated that the presence of very low levels of metal impurities, as low as 1.0 ppt, degrades the performance and stability of semiconductor devices. And depending on the kind of impurities, oxide property may deteriorate, inaccurate patterns are formed, electrical performance of semiconductor circuits is impaired, which eventually adversely impact manufacturing yields.

Theses contaminants, such as metal impurities, coarse particles, organic impurities, moisture, and the like, may be inadvertently introduced in a chemical liquid during various stages of the production process of the chemical liquid. For example, a chemical liquid comes into contact with a part of a manufacturing (processing) apparatus that has not been properly prepared or treated, and foreign matters may be eluded or extracted from the surface of the manufacturing apparatus, resulting in unwanted elevations in trace metals, particulates, and/or organic contaminants in the chemical liquid.

Therefore, it is imperative to significantly improve and to rigorously control the standard and quality of a chemical liquid production process and a manufacturing apparatus applied in the process in order to form high purity chemical liquids, which are indispensable in the fabrication of ultra-fine and immensely precise semiconductor electronic circuits.

SUMMARY

Accordingly, to form highly precise integrated circuits, the demands for ultra-pure chemical liquids, and the quality improvement and control of theses liquids become very critical. Specific key parameters targeted for quality improvement and control include: trace-metal reduction, liquid particle count reduction, on-wafer defect reduction, organic contaminant reduction, etc. All these key parameters are shown to be impacted by a proper design of a production process and a requisite preparation of a manufacturing apparatus.

In view of the above, the present disclosure is to provide particularly a method for processing a chemical liquid adopted in semiconductor manufacturing, wherein a high purity chemical liquid is produced with the number of unwanted particulates and the amount of metallic impurities in the chemical liquid managed within predetermined ranges. Hence, the occurrence of residue and/or particle defects is suppressed and the yield of semiconductor wafer is improved.

In accordance with some embodiments of the present disclosure, a method for processing a chemical liquid includes providing a system that includes at least one filtration medium selected from a filter, an ion exchange membrane, and an ion adsorption membrane; performing a treatment process on the system using a treatment liquid having a content of iron (Fe) and calcium (Ca) limited to about 10 ppb or less; and subsequent to the treatment process, processing a chemical liquid with the system configured in an apparatus.

According to certain exemplary embodiments, the method includes configuring the system in the apparatus after the treatment process.

According to certain exemplary embodiments, the method includes configuring the system in the apparatus before the treatment process is performed.

In accordance with alternative embodiments of the present disclosure, a method for processing a chemical liquid includes providing a first purification system comprising at least one first filtration medium, selected from a first filter, a first ion exchange membrane, and a first ion adsorption membrane; performing a purification process on a chemical liquid with the first purification system configured in a production apparatus; and applying a first treatment liquid to the at least one first filtration medium before the purification process is performed, wherein a content of iron (Fe) and calcium (Ca) in the first treatment liquid is preferably less than about 10 ppb.

According to certain exemplary embodiments, the method further includes providing a second purification system comprising at least one second filtration medium, selected from a second filter, a second ion exchange membrane, and a second ion adsorption membrane; and applying a second treatment liquid to the at least one second filtration medium before the purification process is performed wherein a content of iron (Fe) and calcium (Ca) in the second treatment liquid is preferably less than about 10 ppb.

According to the present disclosure, a method of processing a chemical liquid is effectively designed and properly prepared to obviate an introduction of a wide range of organic and inorganic contaminants during the production process and to produce a high purity chemical liquid applicable in semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
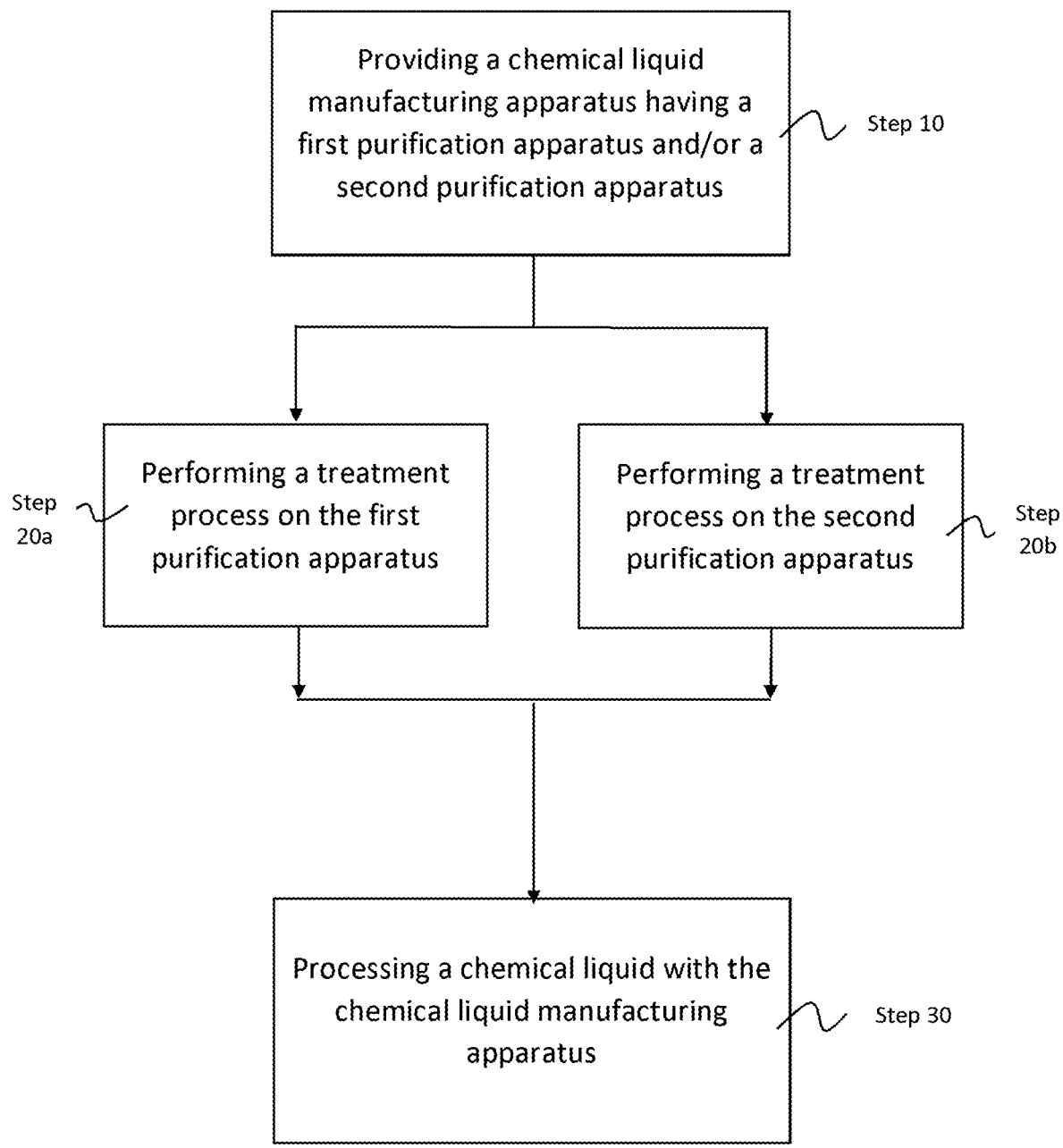
FIG. 1A is a flow chart of steps in an exemplary method for processing a chemical liquid in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, when the term "solvent(s)" is used, if not specifically stated (unless otherwise noted), it may refer to a single solvent or a combination of two or more solvents. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a numerical range indicated by using a term "to" means a range which includes numerical values described before and after the term of "to", as a lower limit value and an upper limit value.

In the present disclosure, "ppm" means "parts-per-million (10-6)", "ppb" means "parts-per-billion (10-9)" and "ppt" means "parts-per-trillion (10-12)".

In the present disclosure, 1 Å (angstrom) corresponds to 0.1 nm (nanometer) and 1 μm (micron) corresponds to 1000 nm.

<Chemical Liquid>

In the present disclosure, a chemical liquid may include a wafer processing solution such as, a pre-wetting liquid, a developer solution, a rinsing solution, a cleaning solution, a stripping solution and the like, or a raw material solvent used for the production thereof.

Prior to being subjected to the processing of the present disclosure which includes, but is not limited to, a purification process, a chemical liquid may contain an undesirable amount of contaminants and impurities. After the chemical liquid is being processed by a chemical liquid manufacturing apparatus of the present disclosure, substantial amounts of the contaminants and impurities are removed from the chemical liquid. A post-processing chemical liquid is referred herein in the present disclosure as a "processed chemical liquid". A "processed chemical liquid" may include impurities controlled and limited within predetermined ranges.

<Organic Solvent>

In the present disclosure, the chemical liquid includes an organic solvent. The type of organic solvent is not particularly limited, but well-known organic solvents are applicable. The content of the organic solvent in the chemical liquid is not particularly limited, but the organic solvent is included as the main component. Specifically, the content of the organic solvent is equal to or greater than 98 mass % with respect to the total mass of the chemical liquid. In certain embodiments, the content of the organic solvent is equal to or greater than 99 mass % with respect to the total mass of the chemical liquid. In other embodiments, the content of the organic solvent is equal to or greater than 99.5 mass % with respect to the total mass of the chemical liquid. In yet other embodiments, the content of the organic solvent is equal to or greater than 99.8 mass % with respect to the total mass of the chemical liquid. The upper limit value thereof is not particularly limited, but it is in general that the upper limit value thereof is equal to or smaller than 99.999 mass %.

The organic solvent may be singly used or may be used in combination of two kinds or more thereof. In a case where a combination of two kinds or more of organic solvents is used, it is preferable that the total content thereof is in the above range.

The content of the organic solvent in the chemical liquid can be measured by using a gas chromatography mass spectrometry (GCMS) device.

The boiling point of the organic solvent is not particularly limited. However, the boiling point of the organic solvent is preferably lower than 200° C. from a point of improving manufacturing yield of a semiconductor chip. In this disclosure, the boiling point means a boiling point at 1 atm.

The organic solvent is not particularly limited. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-heptanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2, 2-trifluoroethyl ether, ethyl vinyl ether, butyl vinyl ether, allyl ethyl ether, allyl propyl ether, allyl butyl ether, diallyl ether, 2-methoxypropene, ethyl-1-propenyl ether, cis-1-bromo-2-ethoxyethylene, 2-chloroethyl vinyl ether, allyl-1,1,2,2-tetrafluoroethyl ether, octane, isooctane, nonane, decane, methylcyclohexane, decalin, xylene, ethylbenzene, diethylbenzene, cumene, second-butylbenzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, γ-butyrolactone, isoamyl acetate, chloroform, dichloromethane, 1,4-dioxane, hexyl alcohol, 2-heptanone, isoamyl acetate, and tetrahydrofuran.

In certain embodiments of the present disclosure, the chemical liquid is a pre-wetting liquid. The type of pre-wetting liquid is not particularly limited. Specific examples of a pre-wetting liquid include at least one of cyclopentanone (CyPe), cyclohexanone (CyH), propylene glycol monomethyl ether (PGME), propylene glycol monoethyl ether (PGEE), propylene glycol monomethyl ether acetate (PGMEA), propylene glycol monopropyl ether (PGPE), ethyl lactate (EL). In other embodiments, the chemical liquid may be a developer solution such as butyl acetate, or a rinsing liquid such as 4-methyl-2-pentanol (MIBC).

<Impurities>

Impurities contained in a processing target and/or a chemical liquid include metallic impurities, particles, and others such as organic impurities, moisture, etc.

<Metallic Impurities>

The most common metallic impurities include heavy metals such as iron (Fe), aluminum (Al), chromium (Cr), nickel (Ni) and ionic metals such as sodium (Na) and calcium (Ca). Depending on the type of metal, metal impurities deteriorate oxide integrity, degrade MOS gate stacks, reduce lifetime of devices, etc. In a chemical liquid produced by the processing method of the present disclosure, the total trace metal content is preferred to be within a predetermined range of 0 to 150 ppt in mass.

In this disclosure, metal impurities refer to metal impurities that are provided in a form of a solid (metal simplex, particulate metal-containing compound, and the like).

In this disclosure, the total trace metal in a chemical liquid is measured by inductively coupled plasma mass spectrometry (ICP-MS). The OWMP (on-wafer metal particle) is determined by inspecting the wafer with a combination of a laser-based inspection system and an EDX (energy dispersive x-ray) inspection. The measurement methods of the total trace metal using ICP-MS and the on-wafer metal particle (OWMP) using laser and EDX are as described in the examples below.

<Particles>

In the present disclosure, the counting targets which have a size of 0.03 μm or greater are referred to as "particles". The number of "particles" in a liquid medium are to be countered by a light scattering type in-liquid particle counter and is referred as LPC (liquid particle count).

Examples of particles include dust, dirt, organic solid matters, and inorganic solid matters. The particles also may include impurities of colloidalized metal atoms. The type of the metal atoms that are easily colloidalized is not particularly limited, and may include at least one metal atom selected from the group consisting of Na, K, Ca, Fe, Cu, Mg, Mn, Li, Al, Cr, Ni, Zn, and Pb. In a chemical liquid prepared by the chemical liquid manufacturing apparatus of the present disclosure, the total content of the particles having a size of 0.03 μm or more is preferred to be within a predetermined range of 100 or less per 1 ml of the chemical liquid.

<Organic Impurities>

Organic impurities mean a compound which is different from the organic solvent as the main component provided in the chemical liquid and refer to organic matter which is contained in the content of 5000 mass ppm or smaller with respect to the total mass of the chemical liquid corresponds to the organic impurities and does not correspond to the organic solvent.

Volatile organic compounds are present in ambient air even inside a clean-room. Some of the organic impurities originate from the shipping and storage equipment, while some are presented in a raw material from the start. Other examples of organic impurities include a by-product generated when the organic solvent is synthesized and/or an unreacted reactant.

The total content of the organic impurities in the chemical liquid is not particularly limited. From a point of improving the manufacturing yield of a semiconductor device, the total content of the organic impurities is preferably 0.001 to 5000 mass ppm, more preferably 0.003 to 2000 mass ppm, further preferably 0.005 to 1000 mass ppm, particularly preferably 0.008 to 500 mass ppm, and most preferably 0.01 to 100 mass ppm, with respect to the total mass of the chemical liquid.

The content of the organic impurities in the chemical liquid can be measured by using a gas chromatography mass spectrometry (GCMS) device.

In the following, the embodiments of the present disclosure describe an exemplary method for processing a chemical liquid. The method for processing a chemical liquid includes at least performing a treatment process on a part of a chemical liquid manufacturing apparatus that may come into contact with a chemical liquid, such that unwanted foreign matters that may be extracted or eluted from the part of the manufacturing apparatus into the chemical liquid is mitigated or precluded. The treatment process is conducted prior to the processing of a chemical liquid implemented by the chemical liquid manufacturing apparatus of the disclosure. As such, the processed chemical liquid is tightly controlled to meet or exceed ultra-high purity standards with the number of particulates and the amount of metallic impurities in the processed chemical liquid effectively managed within desirable ranges. Ultimately, the occurrence of residue and/or particle defects is suppressed and the yield of semiconductor wafer is improved.

<Method of Processing Chemical Liquid>

Although the steps of the method for processing a chemical liquid are illustrated and described as a series of acts or events, it is appreciated that the illustrated ordering of such acts or events are not to be interpreted in a limiting sense. In addition, not all illustrated process or steps are required to implement one or more embodiments of the present disclosure.

Figure 2:
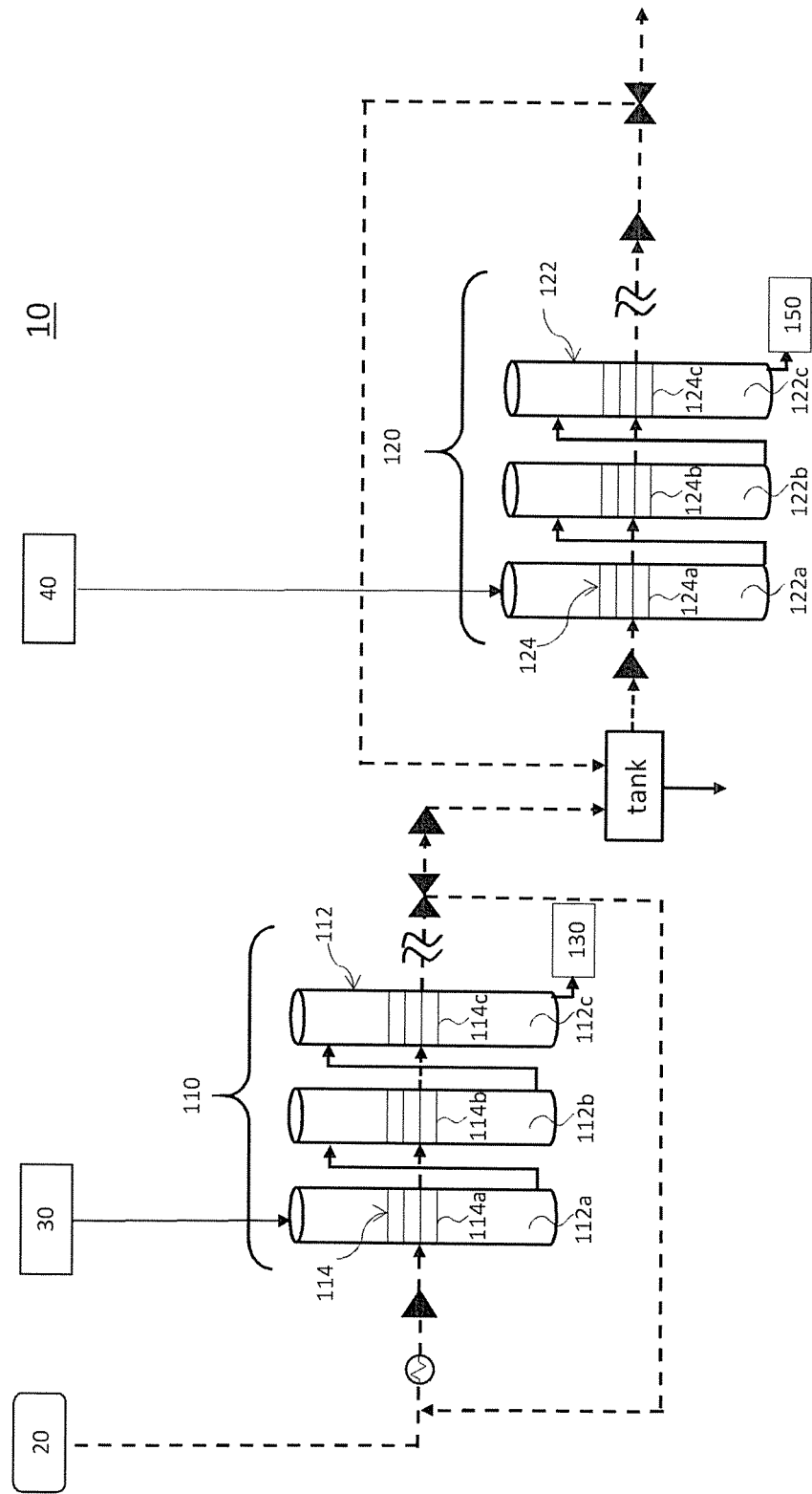
FIG. 2 is a schematic diagram showing an exemplary chemical liquid manufacturing apparatus adopted in a method for processing a chemical liquid in accordance with some embodiments of the present disclosure.

FIG. 1A is a flow chart of steps in an exemplary method for processing a chemical liquid in accordance with some embodiments of the present disclosure. FIG. 2 is a schematic diagram showing an exemplary chemical liquid manufacturing apparatus adopted in a method for processing a chemical liquid in accordance with some embodiments.

Referring to FIGS. 1A and 2, a method for processing a chemical liquid according to some embodiments of the present disclosure includes, in Step 10, providing a chemical liquid manufacturing apparatus 10 for producing a processed chemical liquid. In accordance to the exemplary embodiments of the disclosure, the number of unwanted particulates (particles) and the amount of metallic impurities in the processed chemical liquid are limited within predetermined ranges. In some exemplary embodiments, the chemical liquid manufacturing apparatus 10 comprises at least a first purification system 110. In certain exemplary embodiments, the chemical liquid manufacturing apparatus 10 comprises a second purification system 120 in addition to or in place of the at least first purification system 110.

Still referring to FIGS. 1A and 2, the first purification system 110 includes one or plural filtration media 114 (purification means), each having a specific purification function (mode or medium of a filtration unit) and offering a specific treatment. For example, the purification system 110 may include at least one filtration medium 114 (114a, 114b or 114c) selected from a particle removal filter, an ion exchange membrane, and an ion adsorption membrane. Further, the one or plural filtration media 114 are high-quality grade products that are commercially available from suppliers.

In accordance to certain exemplary embodiments, the one or plural filtration media 114 may be compartmentalized and contained in one or plural housings 112, respectively. For example, the first purification system 110 may include at least one housing 112 selected from a first housing 112a, a second housing 112b, a third housing 112c, and the at least one housing 112 includes and accommodates one or plural units of filtration medium 114 therein. Alternatively speaking, according to the examples above, the first purification system 110 may include just one housing 112 (either the first housing 112a, the second housing 112b, or the third housing 112c), or two housings 112 (a combination of any two of the first housing 112a, the second housing 112b, and the third housing 112c), or three housings (the first housing 112a, the second housing 112b, and the third housing 112c). It is noted that the above examples are for illustrative purposes, and the number of housings is not limited to the shown examples. In other exemplary embodiments, the first purification system 110 may include more housings 112, for example, one, two, three, six, or ten more, in addition to above first, second and third housings (112a, 112b, 112c). In alternative exemplary embodiments, there may be no separate housings 112, and the one or plural filtration media 114 are configured uncompartmentalized in the first purification system 110. In yet other alternative exemplary embodiments, the first purification system 110 may also include other purification modules (not shown) in addition to the one or plural filtration media 114.

As shown in FIG. 2, the first housing 112a may include one or plural units of the first filtration medium 114a, the second housing 112b may include one or plural units of the second filtration medium 114b, the third housing 112c may include one or plural units of the third filtration medium 114c, wherein the first, second, and third filtration media 114a, 114b and 114c may be different in functionality or property, and offer different purification treatments, while the one or more units of the filtration medium 114 (114a, 114b, 114c) accommodated in each of the selected housings 112 (112a, 112b, 112c), respectively, have the same or similar purification function, physiochemical properties, pore size and/or construction material, etc. As an example, the first purification system 110 may include one or plural particle removal filters, one or plural ion exchange membranes, and one or plural ion adsorption membranes accommodated in the first housing 112a, the second housing 112b, and the third housing 112c, respectively. In another example, the first purification system 110 may include one or plural particle removal filters and one or plural ion exchange membranes accommodated in the first housing 112a and the second housings 112b, respectively. In yet another example, the first purification system 110 may include one or plural particle removal filters and one or plural ion adsorption membranes accommodated in the first housing 112a and the second housings 112b, respectively. It is noted that the above examples are for illustrative purposes and are not intended to be limiting.

The number of units of filtration medium 114 (114a, 114b, 114c) accommodated respectively in each of the selected housings 112 (112a, 112b, 112c) is not limited. In some embodiments, the number of units of filtration medium 114 accommodated in each of the selected housings 112 may range inclusively from one to thirty, for example, one, two, ten, fifteen, twenty, thirty or any range between any two of the preceding number of units. In alternative embodiments, the number of units of filtration medium 114 may be above thirty. It is noted that the number of units of filtration medium 114 accommodated in each of the selected housings 112 is not limited to the shown examples.

Referring again to FIGS. 1A and 2, the method for processing a chemical liquid includes, in Step 20a, performing a treatment process on the first purification system 110 having one or more filtration media 114 with a treatment liquid prior to delivering a chemical liquid 20 to the first purification system 110 to be processed by the first purification system 110 of the chemical liquid manufacturing apparatus 10. In some exemplary embodiments, the treatment process includes a washing process wherein innate impurities embedded in the filtration media 114 can be removed. More specifically, the one or more units of the filtration medium 114 (114a, 114b, 114c) accommodated in each of the selected housing(s) 112 (112a, 112b, 112c) are washed with a washing liquid 30. It is noted that the treatment process on the first purification system 110 is not limited as such.

In accordance to some exemplary embodiments of the disclosure, the treatment process in step 20a may be carried out by immersing the filtration media 114 (114a, 114b, 114c) in a treatment liquid for a predetermined time period. In yet other exemplary embodiments, the treatment process may involve combining immersing and washing to reduce the amount of wet particles in the filtration media 114 and to improve treatment efficiency.

According to the present disclosure, the washing liquid used in the washing process is not particularly limited, and well known washing liquids can be used. For example, water and an organic solvent, in which particulates (particles), metallic impurities, and organic impurities are sufficiently reduced therein, can be used. In certain embodiments, the chemical liquid itself or a liquid obtained by diluting the chemical liquid can be used as the washing liquid. In accordance to some exemplary embodiments, the washing liquid is the same as at least one of the organic solvents contained in the chemical liquid to be processed, with the proviso that the at least one of the organic solvents is a high-purity product containing just a small amount of impurities. As a criterion of a washing liquid (30, 40) of the present disclosure, the content of iron (Fe) and calcium (Ca) in the washing liquid applied in the washing process is limited to about 10 ppb or less.

Examples of an organic solvent used as a washing liquid in the disclosure include, but not limited to, alkylene glycol monoalkyl ether carboxylate, alkylene glycol monoalkyl ether, lactic acid, alkyl ester, alkyl alcohol, alkyl alkoxypropionate, cyclic lactone (preferably 4 to 10 carbon atoms), a monoketone compound (preferably 4 to 10 carbon atoms) which may have a ring, alkylene carbonate, alkoxy alkyl acetate, and alkyl pyruvate.

More specifically, examples of the washing liquid include, but not limited to, isopropanol, propylene glycol monomethyl ether (PGME), propylene glycol monomethyl ether acetate (PGMEA), propylene glycol monoethyl ether (PGEE), propylene glycol monopropyl ether (PGPE), ethyl lactate (EL), dimethyl sulfoxide (DMSO), n-methyl pyrrolidone (NMP), diethylene glycol (DEG), ethylene glycol (EG), dipropylene glycol (DPG), propylene glycol, propylene ethylene carbonate, propylene carbonate, sulfolane, cyclohexane, cyclohexanone (CyH), cycloheptanone (CyHe), cyclopentanone (CyPe), 2-heptanone, γ-butyrolactone. Further, two or more different types of these organic solvents may be mixed and used as a cleaning liquid, or may be used without mixing.

Still referring to both FIGS. 1A and 2, the method of the washing is not particularly limited. In some exemplary embodiments, the washing process includes flushing or rinsing with a generous quantity of fluid. More specifically, the one or more units of the filtration medium 114 (114a, 114b, 114c) accommodated in each of the selected housing(s) 112 (112a, 112b, 112c) is flushed with a washing liquid 30.

In the context that the washing process includes flushing, a predetermined amount of the washing liquid 30 is dispensed into a first housing of the selected housings 112 (112a, 112b, 112c) which are concatenated together, and the washing liquid 30 is caused to flow or cascade through the filtration media 114 in each of the selected housings 112 (112a, 112b 112c), so that each unit of the filtration media 114 will come in full contact with the washing liquid, and any innate impurities lodged or embedded in the filtration media 114 will be carried away by the washing liquid 30. The washing liquid 30 then exits the last housing (for example the third housing 112c) of the selected housings 112 and is collected in a discharge tank 130. In the above exemplary embodiments, the washing liquid 30 is conveyed to the first housing in the first purification system 110 via a conduit separated from a conduit for delivering a chemical liquid 10 to the chemical liquid manufacturing apparatus 10 for processing. However, it is noted that the above examples are for illustrative purposes and are not intended to be limiting. In alternative embodiments, the washing liquid 30 and the chemical liquid 20 may be delivered to the first purification system 10 of the chemical liquid manufacturing apparatus 10 via a same conduit.

The amount of the washing liquid used in a washing or flushing process is not particularly limited. A practical amount of washing liquid adopted in a washing or flushing process in some embodiments of the disclosure may range inclusively from 5 to 500 gallons per each housing 112 per one washing cycle (one time of washing); for example, the amount of washing liquid may be about 5, 10, 20, 50, 100, 200, 300, 400, 500 gallons per housing 112 per washing cycle, including any range between any two of the preceding amounts.

As an example, when about 10 gallons of washing liquid is applied to wash or flush each housing 112 of filtration media 114, and in a scenario where a purification system 110 having three housings (112a, 112b, 112c) of filtration media 114 (114a, 114b, 114c), as exemplified in FIG. 2, is to be washed or flushed, a total of 30 gallons of washing liquid 30 is dispensed into the first purification system 110 per one washing cycle. More specifically, about thirty gallons of washing liquid 30 is dispensed into the first housing 112a.

The washing liquid 30 then travels in a forward flow direction from the first housings 112a to the second housing 112b and finally drains from the third housing 112c into the discharge tank 130, so that each unit of the filtration media (114a, 114b, 114c) in each of the housings (112a, 112b, 112c) is flushed and washed with the washing liquid 30.

It is noted that the above examples are for illustrative purposes, and the number of housings 112 of filtration media 114 to be treated or washed is not limited to the shown examples. In other exemplary embodiments, the number housings 112 of filtration media 114 to be treated or washed may be, for example, 1, 2, 5, or 10, and the amount washing liquid used is correspondingly about 10, 20, 50 or 100 gallons per one washing cycle. Further, the above exemplary amount of 10 gallons of washing liquid per housing per washing cycle is for illustrative purposes and is not intended to be limiting. The amount of washing liquid used per housing per washing cycle may vary in accordance with the source, the type, and the initial condition of the filtration media 114 (114a, 114b, 114c), for example, 30 gallons, 55 gallons, 150 gallons or 400 gallons of washing liquid may be adopted per housing per washing cycle. The initial condition of the filtration media 114 is the condition in which the filtration media 114 are obtained, for example, from the supplier.

The number of cycles (times) of washing or flushing performed is not particular limited, and may vary in accordance with the source, the type, and the initial condition of the filtration media 114 (114a, 114b, 114c). In certain embodiments of the present disclosure, washing or flushing of the filtration media 114 is a single process (1×), and a chemical liquid 20 is delivered to the first purification system 110 to be processed after the single washing or flushing process is completed. In some alternative embodiments, the washing or flushing may be performed for plural cycles (times), for example, two (2×), three (3×), four (4×), six (6×), or eight (8×) cycles, wherein a fresh batch of washing liquid is used for each cycle. In this disclosure, "fresh batch of washing liquid" means a washing liquid that has not been used previously in the washing or flushing process, and a content of iron (Fe) and calcium (Ca) in the washing liquid is about 10 ppb or less.

As an example, in accordance to the above illustrated example of applying 10 gallons of the washing liquid to wash or flush the filtration media 114 (114a, 114b, 114c) in each housing 112 of the three housings (112a, 112b, 112c), a total of sixty gallons (30+30) of washing liquid will be consumed in the washing or flushing process of two cycles (2×). In this context, a fresh batch of thirty gallons of washing liquid is used during the first cycle (time) of washing or flushing, and another fresh batch of thirty gallons of washing liquid is used during the second cycle (time) of washing or flushing. It is noted that the above examples are for illustrative purposes, and the number of housings, the amount of washing liquid applied per housing per cycle, and the number of washing cycles are not limited to the shown examples.

In other embodiments, to achieve the effects of washing or flushing of multiple cycles, a totality of the washing liquid intended for all the washing cycles combined is applied collectively to wash or flush the filtration media 114 in the housings 112. For example, the washing or flushing process of two cycles as exemplified above may be achieved by applying a total of sixty gallons of washing liquid 30 as a whole to wash or flush the filtration media 114 (114a, 114b, 114c) in each housing 112 of the three housings (112a, 112b, 112c).

Referring to FIG. 2, the chemical liquid manufacturing apparatus 10 may further include a second purification system 120 which communicates with the first purification system 110 either directly or indirectly, wherein the second purification system 120 includes one or plural filtration media 124. In the exemplary embodiments as shown in FIG. 2, the second purification system 120 is configured downstream from the first purification system 110; however, it is noted that the relative configuration of the first purification system 110 and the second purification system 120 is not limited to the shown examples above.

Similar to the first purification system 110, the one or plural filtration media 124 in the second purification system 120 may be compartmentalized and contained in one or plural housings 122, respectively. For example, the second purification system 120 may include at least one housing 122 selected from a fourth housing 122a, a fifth housing 122b and a sixth housing 122c, and the at least one housing 122 includes and accommodates one or plural units of filtration medium 124 therein. Alternatively speaking, according to the examples above, the second purification system 120 may include one, two, or three housings 122. It is noted that in other exemplary embodiments, the second purifying system 120 may include more housings 122, for example, one, two, five, or ten more, in addition to the fourth housing 122a, the fifth housing 122b and the sixth housing 122c. Further, there may be no separate housings 122, and the one or plural filtration media 124 are configured uncompartmentalized in the second purification system 120. In yet other exemplary embodiments, the second purification system 120 also may include other unillustrated material treatment modules, in addition to the one or plural filtration media 124.

The fourth housing 122a may include one or plural units of the fourth filtration medium 124a, the fifth housing 122b may include one or plural units of the fifth filtration medium 124b, the sixth housing 122c may include one or plural units of the sixth filtrations medium 124c, wherein the fourth filtration medium 124a, the fifth filtration medium 124b, and the sixth filtration medium 124c may be different in functionality or property, and offer different purification treatments, while the one or more units of the filtrations medium 124 (124a, 124b, 124c) accommodated in each of the selected housings 122 (122a, 122b, 122c), respectively, have the same or similar purification function, physiochemical properties, pore size and/or construction material, etc. In some exemplary embodiments, the second purification system 120 may include at least one filtration medium 124 (124a, 124b, 124c) selected from a particle removal filter, an ion exchange membrane and an adsorption membrane. As an example, the second purification system 120 may include three particle removal filters accommodated in the fourth filter housing 122a, and three ion exchange membranes or three ion adsorption membranes accommodated in the fifth filter housing 122b. In another examples, the second purification system 120 may include two, three or four particle removal filters accommodated in the fourth filter housing 122a and another two, three or four particle removal filters accommodated in the fifth filter housing 122b, wherein the particles removal filters in the two housings 122a, 122b are different in terms of pore size and/or construction material. Further, the one or plural filtration media 124 are high-purity grade products that are commercially available and obtained fresh from suppliers.

The number of units of filtration medium 124 (124a, 124b, 124c) accommodated respectively in each of the selected housings 122 (122a, 122b, 122c) is not limited. In some embodiments, the number of units of filtration medium 124 accommodated in each of the selected housings 122 may range inclusively from one to thirty, for example, one, two, ten, fifteen, twenty, thirty, or any number between any two of the preceding number of units. In alternative embodiments, the number of units of filtration medium 124 may be above thirty. It is noted that the number of units of filtration medium 124 accommodated in each of the selected housings 122 is not limited to the shown examples.

Referring again to FIG. 1A, the method for processing a chemical liquid also includes, in Step 20b, performing a treatment process on the second purification system 120 having one or more filtration media 124 with a treatment liquid prior to the processing of a chemical liquid with the chemical liquid manufacturing apparatus 10 of the present disclosure.

The principles of the treatment process applied to the second purification system 120 are similar to those applied to the first purification system 110 as exemplified above. For example, the treatment process performed on the second purification system 120 may include a washing process. More specifically, in Step 20b, the one or more units of the filtration medium 124 (124a, 124b, 124c) accommodated in each of the selected housing(s) 124 (122a, 122b, 122c) of the second purification system 20 are washed with a washing liquid 40.

Further, in the context that the washing process includes flushing, a predetermined amount of washing liquid 40 is dispensed into a first housing of the selected housings 122 in the second purification system 120 to wash or flush the one or more units of the filtration medium 124 (124a, 124b, 124c) accommodated in each of the selected housing(s) 122 (122a, 122b, 122c), which are concatenated together in the second purification system 120. The washing liquid 40 is caused to flow or cascade through the filtration media 124 in each of the selected housings 122, so that each unit of the filtration media 124 comes in full contact with the washing liquid, and innate impurities embedded or lodged in the filtration media 124 will be rinsed away by the washing liquid 40. The washing liquid 40 then exits from the last housing (for example, the sixth housing 122c) of the selected housing(s) 122 and is collected in a discharge tank 150. It is noted that above exemplary treatment process applied to the second purification system 120 is for illustrative purposes and is not intended to be limiting.

Still referring to FIG. 1A, after completing the treatment process on the first purification system 110 in Step 20a and/or completing the treatment process on the second purification system 120 in Step 20b, the processing of a chemical liquid 20 is implemented in Step 30 by adopting the chemical liquid manufacturing apparatus 10 of the present disclosure. The processing of a chemical liquid in Step 30 includes, for example, performing a purification process on the chemical liquid 20 using the post-treated first purification system 110 and/or the post-treated second purification system 120 installed in the chemical liquid manufacturing apparatus 10.

In accordance to some embodiments, the treatment of the first purification system 110 and the treatment of the second purification system 120 are executed individually and separately, but may be implemented concurrently or sequentially. More specifically, the type(s) of treatment liquid, the treatment conditions, the amount(s) of treatment liquid used, the number(s) of treatment cycles, the treatment methods (flushing, immersing, or both), etc. applied to treat the filtration media 114 of first purification system 110 and those applied to treat the filtration media 124 of the second purification system 120 may be the same as, similar to or may vary from each other, depending on the sources, the types, and the conditions of the filtration media 114 and 124, and the numbers of selected housings 110 and 120 to be treated in the respective purification system 10, 20.

As an example, cyclohexanone may be used as a washing liquid 30 for treating the filtration media 114 of first purification system 110, and as a washing liquid 40 for treating the filtration media 124 of the second purification system 120; however, the treatment conditions and the number of treatment cycles mandated for treating the filtration media 114 may be different from the treatment conditions and the number of treatment cycles mandated for treating the filtration media 124. Moreover, the treatment of the first purification system 110 may be performed before, after, or simultaneously with the treatment of the second purification system 120. Further, it is understood that fresh batches of cyclohexanone are applied to first purification system 110 and the second purification system, respectively, and a fresh batch of cyclohexanone is applied for each treatment cycle for the treatment of the purification systems 110 and 120, respectively. It is noted that the above examples are for illustrative purposes and are not intended to be limiting.

For a majority of the filtration media 114 and 124 and the treatment liquids applied in the treatment process, the treatment process is performed under ambient condition (room temperature and atmospheric pressure). However, in some exemplary embodiments, the treatment condition is a function of the filtration media (114, 124) and/or the treatment liquids used for the treatment thereof. Under certain exemplary implementations, the treatment condition is controlled to below or above the ambient condition. For example, the washing or flushing of a certain ion exchange membrane or ion adsorption membrane is executed below room temperature, such as below 80° F. or below 77° F. when certain cyclic aliphatic ketone organic solvents are used as a washing liquid. As an example, the washing or flushing of an ion exchange membrane is executed below 70° F. when cyclohexanone (CyH) is applied as a washing liquid.

When the filtration media 114, 124 are subjected to a washing or flushing process, the flow rate of a washing liquid flowing or passing through the filtration media 114, 124 is typically controlled to be slower than a normal operating flow rate of about 10 to 12 gallons/minute when a chemical liquid 20 is processed. For example, the flow rate of a washing liquid during a washing or flushing process may range from as low as about 1 gallon/minute up to about 10 gallons/minute, for example, about 1, 2, 5 or 8 gallons/minute. These are, of course, merely examples and are not intended to be limiting. In other embodiments, the flow rate may exceed 10 gallons/minute, for example, 18 to 20 gallons/minute.

Figure 1B:
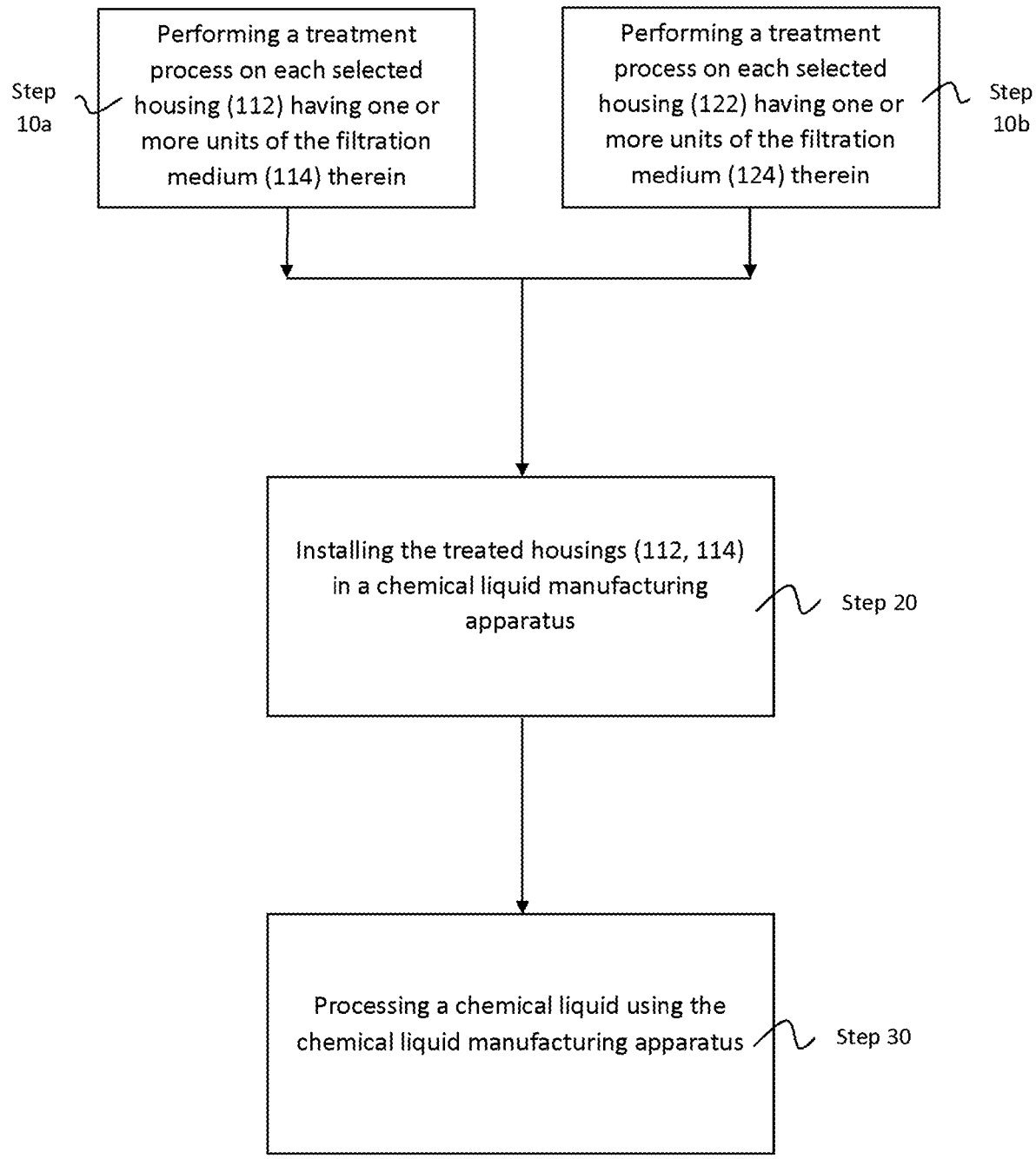
FIG. 1B is a flow chart of steps in an exemplary method for processing a chemical liquid in accordance with some embodiments of the present disclosure.

Moreover, in accordance to some embodiments of the disclosure as shown in FIG. 1A, the treatment process is performed in-situ to the one or more units of the filtration medium (114, 124) in each of the selected housing(s) (112, 122) that are configured in the purification system (110, 120), installed already in the chemical liquid manufacturing apparatus 10. In alternative embodiments, an off-line treatment process may be carried out. The off-line treatment process, as shown in FIG. 1B, is substantially equivalent to the in-situ treatment process discussed above with a major difference in that each of the elected housing(s) (112, 122) having the one or more units of the filtration medium (114, 124) accommodated therein is subjected to a treatment process, as exemplified above, before the elected housing(s) (112, 122) are configured in the purification system (10, 20), respectively and installed in the chemical liquid manufacturing apparatus 10. More particularly, as shown in FIG. 1B, a treatment process is performed on each of the selected housing(s) (112) having one or more units of the filtration medium 114 therein in Step 10*a*, wherein the treatment process may be the same or different for each of the selected housing(s) (112). Similarly, a treatment process is performed on each of the selected housing (122) having one or more units of the filtration medium 124 therein in step 10*b*, wherein the treatment process may be the same or different for each of the selected housing(s) (122). After the treatment processes as in Step 10*a*, Step 10*b* are completed, the elected housing(s) 112 are configured together as a post-treated first purification system 110, and the elected housing(s) 122 are configured together as a post-treated second purification system 120, which are to be installed in a chemical liquid manufacturing apparatus 10 in Step 20. Thereafter, the processing of a chemical liquid 20 is implemented in Step 30 by adopting the post-treated first purification system 110 and the post-treated second purification system 120 configured in the chemical liquid manufacturing apparatus 10 of the present disclosure.

[Particle Removal Filter]

The particle removing process is a process of removing particles and/or metal impurities (metal impurities in a solid form) in a processing target, such as a chemical liquid, by using a particle removal filter. The particle removal filter is not particularly limited, and well-known particle removal filters can be used.

Although the average pore size (pore diameter) of the filter is not particularly limited, it is suitably about 0.001 to 1.0 μm (1 nm to 1000 nm), preferably about 0.003 to 0.5 μm (3 nm to 500 nm), and more preferably about 0.005 to 0.1 μm (5 nm to 100 nm). Within this range, it is possible to reliably remove foreign matters such as impurities or aggregates contained in the refined product while suppressing clogging of the filter. In certain embodiments of the disclosure, the first material treatment system 110 may include a particle removal filter having an average pore size as small as 2 nm (for example, microfiltration membrane having a pore size of 2 nm or greater), and may range from 0.002 μm (2 nm) or more to about 1.0 μm (1000 nm) or less. In a case where fine particles are provided in the processing target in addition to colloidalized impurities including metal atoms such as iron or aluminum, the processing target is filtered by using a filter having an average pore size as small as 50 nm to remove particles before filtering is performed by using a filter having average pore size as small as 20 nm or 15 nm to remove finer particles. Thus, the filtration efficiency is improved and performance of removing particles is more improved.

In some embodiments of the disclosure, the second filtration system 122 may include a particle removal filter having a pore size as small as 0.001 μm (1 nm), and may range from about 0.001 μm (1 nm) or more to about 0.015 μm (15 nm) or less. In certain embodiments, the second filtration system 120 may include a UPE filter having a pore size as small as 1 nm. Yet in other embodiments, the second filtration system 120 may include a Nylon or a MPTFE filter having a pore size of about 5 nm. Here, the average pore size can refer to the nominal value of the filter manufacturer.

Examples of the material of the filter used in particle removal include a fluororesin such as polytetrafluoroethylene (PTFE), a polyamide resin such as nylon and the like, a polyolefin resin (including high density and ultrahigh molecular weight) such as polyethylene and polypropylene (PP) and the like, a perfluoroalkoxy (PFA) resin and the like, or a modified polytetrafluoroethylene (MPTFE). In view of efficiently removing fine foreign matters such as impurities and/or aggregates contained in a chemical liquid, the filter used in particle removal of the present disclosure is made of at least one selected from the group consisting of nylon, polypropylene (including high density polypropylene), polyethylene, polytetrafluoroethylene, tetrafluoroethylene-perfluoroalkyl vinyl ether copolymer, polyimide, and polyamide imide. According to the filter made of the above material, it is possible to effectively remove foreign matter having high polarity which is likely to cause residue defects and/or particle defects, and it is possible to efficiently reduce the content of the metal component in the chemical liquid.

Polyimide and/or polyamide imide may have at least one selected from the group consisting of a carboxy group, a salt type carboxy group, and a —NH-bond. Regarding solvent resistance, a fluororesin, polyimide, and/or polyamide imide is excellent.

As a commercial filter, for example, filters manufactured by Pall Corporation, ADVANTEC Toyo Roshi Kaisha, Ltd., Entegris Japan Co., Ltd. (former Nihon microlith Corporation) and KITZ MICRO FILTER CORPORATION can be selected from various filters to be provided. In addition, a "P-Nylon filter (pore size of 0.02 µm and critical surface tension of 77 mN/m)" (manufactured by Pall Corporation) made of polyamide; a "PE•clean filter (pore size of 0.02 µm)" (manufactured by Pall Corporation) made of high-density polyethylene; a "PE•clean filter (pore size of 0.01 µm)" (manufactured by Pall Corporation) made of high-density polyethylene; and an "UPE (pore size of 3 nm)" (manufactured by Entegris) made of ultra-high molecular weight polyethylene membrane can be used.

[Ion-Exchange Resin Membrane (Ion-Exchange Membrane)]

The ion-exchange resin membrane used in the present embodiment is not particularly limited, and filters including an ion-exchange resin comprising a suitable ion-exchange group immobilized to a resin membrane may be used. Examples of such ion-exchange resin membranes include strongly acidic cation-exchange resins comprising a cation-exchange group such as a sulfonic acid group chemically modified on the resin membrane, and examples thereof include cellulose, diatomaceous earth, nylon (a resin having an amide group), polyethylene, polypropylene, polystyrene, a resin having an imide group, a resin having an amide group and an imide group, a fluororesin, or a high-density polyethylene membrane and ion-exchange resin membranes with a particle-removing membrane that is a membrane having an integral structure of a particle-removing membrane and an ion-exchange resin membrane. Polyalkylene membranes with an ion-exchange group chemically modified thereon are preferred. Polyalkylenes include, for example, polyethylene and polypropylene, and polypropylene is preferred. Cation-exchange groups are preferred as the ion-exchange group. Ion-exchange resin membranes used in the present embodiment may be commercially available filters with metal ion removal functionality. These filters are elected based on the ion exchange efficiency and with an estimated pore size of the filters as small as about 0.2 µm (200 nm).

[Ion Adsorption Membrane]

The ion adsorption membrane has a porous membrane material and has an ion exchange function. Such ion adsorption membrane is not particularly limited as long as it has a pore diameter of 100 µm or less and has an ion exchange function. The material, the type and the like thereof are not particularly limited. Examples of the material of a base material constituting the ion adsorption membrane include, but not limited to, cellulose, diatomaceous earth, film material of microfiltration membrane such as nylon (resin having amide group), polyethylene, polypropylene, polystyrene, resin having imide group, resin having amide group and imide group, fluororesin, or high density polyethylene resin, a membrane material having an ion exchange ability functional group introduced therein, or the like. Examples of the shape of the membrane material include a pleated type, a flat membrane type, a hollow fiber type, a porous body as described in JP-A No. 2003-112060 and the like. As the ion exchange group to be introduced into the membrane material, it is preferable to use a combination of at least two of the cation exchange group, the chelate exchange group, and the anion exchange group to optimize the elution and selectivity of the components to be removed. Since the ion adsorption membrane has porosity, it is also possible to remove a part of the fine particles. In certain embodiments of the disclosure, the ion adsorption membrane is, for example, a nylon membrane having a pore diameter as small as 0.02 µm (20 nm).

EXAMPLES

The present disclosure will be more specifically described below based on the following examples. A material, a use amount, a ratio, treatment details, treatment procedures, and the like which will be described the following examples can be appropriately changed in a range without departing from the gist of the present invention. Accordingly, the range of the present disclosure should not be interpreted restrictively by the following examples The selection of the filtration media 114 in the first purification system 110, the number of washing cycles, and the amount of washing liquid applied to treat the selected filtration media were adjusted to obtain a post-treatment washing liquid having a composition in each of the samples at the end of each washing cycle. The filtration media used in the following experiments were high-quality grade products obtained brand new from suppliers. In some of the experiments multiple units of the filters were flushed at one time, but the data presented below were mathematically normalized to a single unit.

<OWPC, OWMC, SP5>

Each post-treatment washing liquid sample was collected and then inserted into a wafer coating tool. After a bare wafer was coated with a sample, the wafer was transferred to and inspected by a laser-based inspection system. By using a laser light, the laser-based inspection system detected, counted, recorded the location and sizes each particle on the wafer, at a detection limit of 19 nm. More specifically, counting targets included particles having a size of 19 nm or greater. The data was used to create wafer maps and provide the total on-wafer particle counts (OWPC), which included all particles having a size of 1000 nm and below. SP5 was a subset of the OWPC which included particles having a size of about 19 nm to about 23 nm.

The wafer was then transferred to be inspected by EDX (energy dispersive x-ray). Each particle reported by the laser-based inspection system was inspected by EDX (energy dispersive x-ray) for providing the elemental information. Any particle, which was found to produce any metal signal, was counted as a metal particle. The total number of particles with a metal signature was totalized to report as OWMP (on-wafer metal particle) or OWMC (on-wafer metal count).

<Evaluation Results>

Figure 3:
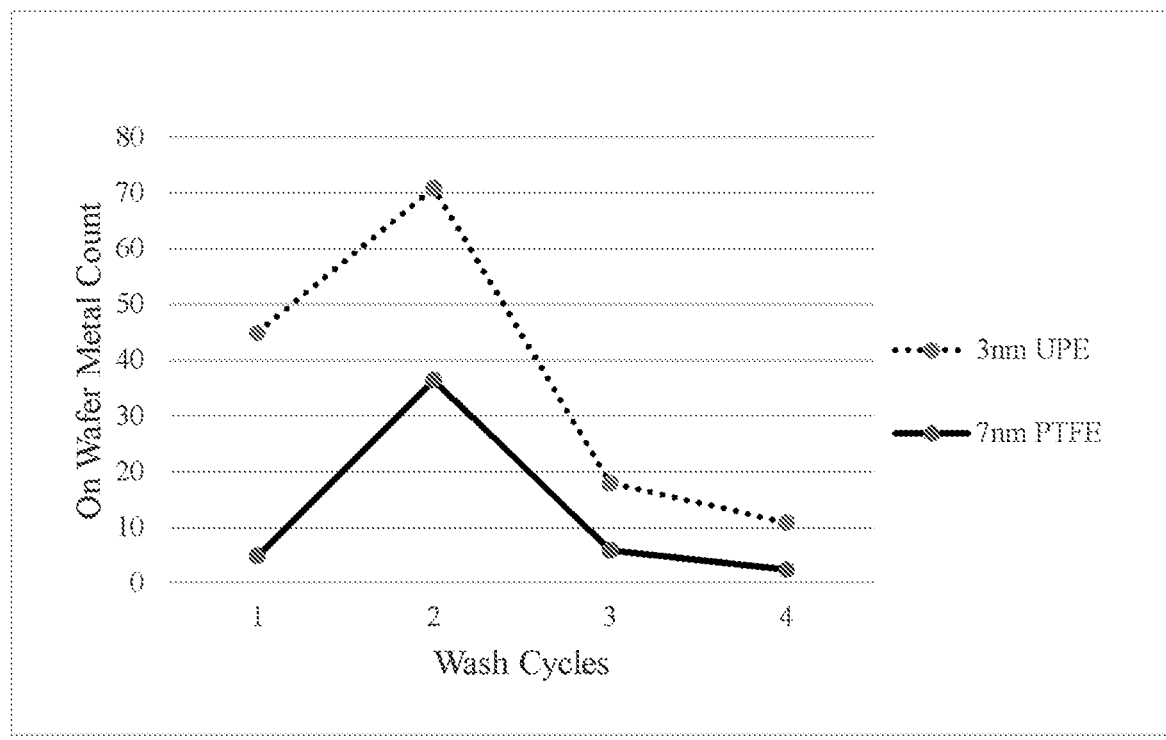
FIG. 3 illustrates the results of OWMC (on wafer metal count) as a function of wash cycles.

In Table 1, a flushing process according to the present disclosure was performed on the first purification system comprising ultra-high MW polyethylene particle (UPE) removal filter(s) having a pore size of 3 nm. The washing liquid used was cyclohexanone in the amount of about 10 to 50 gallons per flush, and the washing liquid was caused to flush or pass through the UPE filter under ambient temperature and an inlet pressure up to 50 psig (pounds per square inch). A sample was collected at the end of each of the four cycles of flushing (1st flush, 2nd flush, 3rd flush, and 4th flush). The OWPC, OWMC (or OWMP), and counts of selected metal elements in each sample were measured and the normalized data were summarized in Table 1. FIG. 3 also graphically illustrates the OWMC results.

TABLE 1

Washing liquid: Cyclohexanone
Amount of washing liquid in each flush: 10 gallons
Filter type: UPE (ultra-high MW polyethylene)
Pore size: 3 nm

| | Amount of washing liquid (gallons) | | | |
|---|---|---|---|---|
| | 1st flush 10 gallons | 2nd flush 10 gallons | 3rd flush 10 gallons | 4th flush 10 gallons |
| OWMC | 45 | 71 | 18 | 11 |
| Ti | 1 | 0 | 0 | 1 |
| Fe | 8 | 9 | 12 | 1 |
| Mg | 6 | 5 | 4 | 0 |
| Al | 27 | 13 | 1 | 1 |
| Zn | 3 | 41 | 0 | 6 |

As illustrated in Table 1 and FIG. 3, the treatment process of the present application was shown to have achieved the desired advantages of significantly reducing the OWMC and counts on the selected metal elements for the UPE filter. The data also indicated that the effects of the treatment process were even more pronounced after the 3rd flush. At the end of the $4^{th}$ flush, the OWMC was reduced by fourfold, compared to the OWMC after the $1^{st}$ flush. Further, the counts of the various selected metal elements, such as Al, Fe, Mg, etc., also significantly diminished by the end of the $4^{th}$ flush.

TABLE 2

Washing Liquid: Cyclohexanone
Amount of washing liquid in each flush: 50 to 400 gallons
Filter type: PTFE
Pore size: 7 nm

| | 1st flush | | 2nd flush | | 3rd flush | | 4th flush | |
|---|---|---|---|---|---|---|---|---|
| | Test 1 | Test 2 | Test 1 | Test 2 | Test 1 | Test 2 | Test 1 | Test 2 |
| OWPC | 457 | 459 | 407 | 366 | 327 | 272 | 183 | 235 |
| OWMC | 0 | 10 | 65 | 8 | 7 | 5 | 2 | 3 |
| Ti | 0 | 1 | 1 | 1 | 1 | 3 | 0 | 1 |
| Fe | 0 | 1 | 24 | 3 | 1 | 0 | 1 | 0 |
| Mg | 0 | 2 | 0 | 2 | 1 | 0 | 1 | 1 |
| Al | 0 | 4 | 23 | 0 | 3 | 2 | 0 | 1 |
| Zn | 0 | 0 | 0 | 0 | 0 | 0 | 0 | 0 |

In Table 2, a similar flushing process according to the present disclosure was performed on a first purification system comprising high density polyethylene particle removal filter(s) having a pore size of 7 nm. The washing liquid used in this treatment process was cyclohexanone and was in the amount of 50 to 400 gallons per flush. The washing liquid was caused to flush or pass through the HDPE filter under ambient temperature and an inlet pressure up to 50 psig. Two separate but identical tests were conducted for each flush cycle, wherein a sample was collected at the end of each one of the four flush cycles (1st flush, 2nd flush, 3rd flush, and 4th flush) from each of the two tests. The OWPC, OWMC, and counts on selected metal elements in each sample were measured and the normalized data were summarized in Table 2. FIG. 3 also graphically illustrates the average of the OWMC results from the two tests.

The data as summarized in Table 2 and illustrated in FIG. 3 demonstrated that the treatment process of the present application was effective in improving the tested attributes for the PTFE filters. As shown in Table 2, the OWPC continued to reduce as the number of flush cycles increased. The data also reflected that the OWPC, the OWMC, and the counts on selected metal elements were desirably improved after the 3rd flush.

TABLE 3

Washing Liquid: Cyclohexanone
Filter type: HDPE (High density polyethylene)
Pore size: 2 nm

| | Flushing Test | |
|---|---|---|
| | Test 1 Initial Flush (1×) | Test 2 4 Times Flushing (4×) |
| Flushing amount (gallons/20" media) | 31 | 126 |
| OWPC (1000 nm and below) | 2763 | 559 |
| SP5 (19-23 nm) | 1422 | 276 |
| OWMC (total) | 496 | 28 |
| Al | 96 | 5 |
| Ti | 192 | 9 |
| Fe | 48 | 5 |
| Ni | 48 | 6 |
| Co | 32 | 1 |
| Cu | 16 | 2 |

In Table 3, a flushing process according to the present disclosure was performed under ambient temperature and an inlet pressure up to 50 psig on a purification system comprising HDPE (high density polyethylene) particle removal filter(s) having a pore size of 2 nm. The washing liquid used in this flushing process was cyclohexanone. Two separate tests were performed, wherein during the $2^{nd}$ test, the amount of the washing liquid used was four times the amount used in the $1^{st}$ test. A sample was collected at the end of the flushing of each of the $1^{st}$ and $2^{nd}$ tests. The OWPC, the SP5, the OWMC, and the counts on selected metal elements in each sample were measured and the normalized data were summarized in Table 3.

The results as shown in Table 3 confirmed that the treatment process of the present application achieved the desirable advantages of reducing the OWPC, SP5, OWMC, counts of all the selected metal elements for a HDPE filter. The reductions were even more pronounced after increasing the flush amount (or flush cycle) from about 30 gallons to about 125 gallons (or increasing from a single flush cycle to four flush cycles). The sample from the $2^{nd}$ test was shown to have a fivefold reduction in both the OWPC and the SP5 count, and an eighteen-fold reduction in the OWMC as the amount of washing liquid (the number of wash cycles) increased by fourfold. Typically, the count of particles having a size of about 19 nm to about 23 nm from a pretreated HDPE filter was greater than 10000.

TABLE 4

Washing Liquid: PGMEA (Propylene glycol monomethyl ether acetate)
Filter type: PTFE (Polytetrafluoroethylene)
Pore size: 10 nm

|  | Flushing Test | |
|---|---|---|
|  | Test 1<br>Initial Flush (1×) | Test 2<br>8 Times Flush (8×) |
| Flushing amount (gallons/20" media) |  | 406 |
| OWPC (1000 nm and below) | >500,000 | 1354 |
| SP5 (19-23 nm) |  |  |
| OWMC (total) | saturated | 6 |
| Al |  |  |
| Ti |  |  |
| Fe | saturated | 4 |
| Ni |  |  |
| Co |  |  |
| Cu |  |  |

In Table 4, a similar flushing process was performed, except that PGMEA (propylene glycol monomethyl ether acetate) was used to flush the PTFE (polytetrafluoroethylene) particle filter(s) having a pore size of 10 nm. Two separate tests were performed, wherein in the $2^{nd}$ test, the amount of the washing liquid used was eight times the amount used in the 1 test. A sample was collected at the end of the flushing of each of the $1^{st}$ and $2^{nd}$ tests. The OWPC, the SP5, the OWMC, and the counts on selected metal elements in each sample were measured and the normalized data were summarized in Table 4.

The data as shown in Table 4 further confirmed the notable effects of a substantial reduction in the OWPC and the OWPC after a treatment process of the present disclosure was performed on a PTFE filter. More particularly, the OWPC was significantly reduced from being greater than 500,000 to slightly above 1000 after increasing the amount of washing liquid from about 50 gallons to 400 gallons (or increasing from a single flush cycle to 8 flush cycles). The data also indicated that the OWMC and the Fe count were reduced dramatically from being saturated on the wafer to a single digit (6 and 4, respectively) after increasing the amount of washing liquid by eightfold.

TABLE 5

| Filter type | OWPC < 31 (as received) | OWPC < 31 (post treatment) | OWMC (as received) | OWMC (post treatment) | OWPC < 31 Improvement | OWMC Improvement |
|---|---|---|---|---|---|---|
| <10 nm UPE | 77346 | 446 | 4854 | 5 | 99.4% | 99.9% |
| <10 nm functionalized UPE | 8666 | 293 | 214 | 75 | 96.6% | 65.0% |
| <250 nm functionalized UPE | 2038 | 387 | 364 | 43 | 81.0% | 88.2% |

The data obtained in Table 5 was obtained using the treatment liquid PGMEA (propylene glycol monomethyl ether acetate). The data in this table demonstrates the effect of soaking the filtration medium in the treatment liquid for a time period of about 16 hours, followed by a flush with 50 kg of the treatment liquid. More specifically, the filtration medium was submerged in the treatment liquid overnight at ambient conditions. Thereafter, the filtration medium was placed in the filter housing and was flushed with fresh treatment liquid. As readily seen, soaking prior to flushing of the filtration medium provides a marked improvement in OWPC <31 (<31 nm bin size particles) and OWMC.

In some embodiments, the soaking process may be performed for more than one time period, for example, 2, 3, 4, or 5 periods, wherein each period may range from about 12 to 18 hours. More specifically, the filtration media are placed in a container and submerged in the same type of the treatment liquid to be used in the subsequent treatment process. At the end of each soaking period, the treatment liquid is drained, and fresh treatment liquid is provided for the next soaking period. After the soaking process is completed, the treatment process is commenced to flush the filtration media.

The collective results as summarized in Tables 1 to 5 confirmed the treatment process of the present application achieved the desirable advantages of significantly reducing the OWPC and the OWMC in the various types of filtration medium prior to being applied in the processing of a chemical liquid. These data substantiated that the treatment process of the present disclosure impedes the introduction of unwanted contaminants, which stem from an ineffectively designed and improperly prepared method of processing. Accordingly, the method of processing a chemical liquid of the present disclosure offers the competitive advantages of producing ultra-high purity chemical liquids, avoiding an incurrence of defects on circuit patterns and semiconductor devices, and reducing costs on maintenance and repair.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a chemical liquid, comprising:

providing a purification system comprising at least one filtration medium, selected from a filter, an ion exchange membrane, and an ion adsorption membrane;

performing a soaking process by placing the at least one filtration medium in a container and soaking the at least one filtration medium in a liquid stored in the container for at least a soaking period of about 12 to 18 hours, and there are at most five soaking periods;

after the soaking process, performing a treatment process on the purification system by passing a treatment liquid having a content of iron (Fe) and calcium (Ca) limited to about 10 ppb or less through the at least one filtration medium, wherein the liquid used in the soaking process is the same as the treatment liquid and the treatment liquid is the same as at least one organic solvent contained in the chemical liquid; and subsequent to the treatment process, processing the chemical liquid with the purification system configured in a chemical liquid manufacturing apparatus, wherein the chemical liquid manufacturing apparatus comprises the purification system, and a processed chemical liquid is obtained by introducing the chemical liquid into the chemical liquid manufacturing apparatus and passing the chemical liquid through the purification.

2. The method of claim 1, wherein the purification system is configured in the chemical liquid manufacturing apparatus after the treatment process is performed.

3. The method of claim 1, wherein the purification system is configured in the chemical liquid manufacturing apparatus before the treatment process is performed.

4. The method of claim 1, wherein the treatment process is performed one or more times.

5. The method of claim 1, wherein the treatment process is performed on the purification system comprising at least two filtration media, selected from the filter, the ion exchange membrane, and the ion adsorption membrane.

6. The method of claim 1, wherein the treatment process is performed on the purification system comprising the filter and the ion exchange membrane, or the filter and the ion adsorption membrane.

7. The method of claim 1, wherein the at least one filtration medium is a polytetrafluoroethylene (PTFE) filter having a pore size of 50 nm or less.

8. The method of claim 1, wherein the at least one filtration medium is a polytetrafluoroethylene (PTFE) filter having a pore size of 10 nm or less.

9. A method for purifying a chemical liquid, comprising:
providing a first purification system comprising at least one first filtration medium, selected from a first filter, a first ion exchange membrane, and a first ion adsorption membrane;
performing a purification process on the chemical liquid with the first purification system configured in a chemical liquid manufacturing apparatus; and
before the purification process is performed, performing a soaking process by placing the at least one first filtration medium in a container and soaking the at least one first filtration medium in a liquid stored in the container for at least a soaking period of about 12 to 18 hours, and there are at most five soaking periods;
after the soaking process and before the purification process, applying a first treatment liquid to the at least one first filtration medium, wherein a content of iron (Fe) atoms and calcium (Ca) in the first treatment liquid is less than about 10 ppb, and the liquid used in the soaking process is the same as the first treatment liquid and the treatment liquid is the same as at least one organic solvent contained in the chemical liquid,
wherein the chemical liquid manufacturing apparatus comprises the first purification system, and a processed chemical liquid is obtained by introducing the chemical liquid into the chemical liquid manufacturing apparatus and passing the chemical liquid through the first purification system.

10. The method of claim 9, wherein the step of applying the first treatment liquid comprises flushing the first treatment liquid into the first purification system.

11. The method of claim 9 further comprising:
providing a second purification system comprising at least one second filtration medium, selected from a second filter, a second ion exchange membrane, and a second ion adsorption membrane; and
applying a second treatment liquid to the at least one second filtration medium before the purification process is performed, wherein a content of iron (Fe) and calcium (Ca) in the second treatment liquid is less than about 10 ppb,
wherein the chemical liquid manufacturing apparatus further comprises the second purification system, and the processed chemical liquid is obtained by introducing the chemical liquid into the chemical liquid manufacturing apparatus and passing the chemical liquid through the first purification system and the second purification system.

12. The method of claim 11, wherein the step of applying the second treatment liquid comprises flushing the second treatment liquid into the second purification system.

13. The method of claim 11, wherein the purification process is performed on the chemical liquid with the second purification system configured in the chemical liquid manufacturing apparatus.

14. The method of claim 11, wherein the first purification system and the second purification are configured in the chemical liquid manufacturing apparatus after the steps of applying the first treatment liquid and the second treatment liquid.

15. The method of claim 11, wherein the first purification system and the second purification are configured in the chemical liquid manufacturing apparatus before the steps of applying the first treatment liquid and the second treatment liquid.

16. The method of claim 11, wherein the step of applying the first treatment liquid and the step of applying the second treatment liquid are respectively performed once.

17. The method of claim 11, wherein a number of times of applying the first treatment liquid is different from a number of times of applying the second treatment liquid.

* * * * *